(12) United States Patent
Wu et al.

(10) Patent No.: US 8,796,071 B2
(45) Date of Patent: Aug. 5, 2014

(54) THERMAL DISSIPATION SUBSTRATE

(75) Inventors: YewChung Sermon Wu, Hsinchu (TW); Tai-Min Chang, Hsinchu (TW); Yu Chia Chiu, Hsinchu (TW); Jen-Li Hu, Hsinchu (TW)

(73) Assignee: National Chiao Tung University (TW)

( * ) Notice: Subject to any disclaimer, the term of this patent is extended or adjusted under 35 U.S.C. 154(b) by 7 days.

(21) Appl. No.: 13/548,477

(22) Filed: Jul. 13, 2012

(65) Prior Publication Data
US 2012/0273803 A1    Nov. 1, 2012

(51) Int. Cl.
*H01L 21/00*    (2006.01)

(52) U.S. Cl.
USPC ............................................. 438/105; 257/77

(58) Field of Classification Search
USPC ............. 257/77, E23.111, E21.005, E21.041, 257/E29.002, 52; 438/105, 113, 46, 455, 438/197
See application file for complete search history.

(56) References Cited

U.S. PATENT DOCUMENTS

| | | | |
|---|---|---|---|
| 2004/0175875 A1* | 9/2004 | Sung | 438/197 |
| 2006/0213428 A1* | 9/2006 | Meguro et al. | 117/84 |
| 2006/0220514 A1* | 10/2006 | Tatsumi et al. | 313/309 |
| 2006/0243983 A1* | 11/2006 | Chang et al. | 257/77 |
| 2009/0038234 A1* | 2/2009 | Yen | 51/295 |
| 2010/0258813 A1* | 10/2010 | Lee et al. | 257/76 |
| 2011/0037076 A1* | 2/2011 | Kato et al. | 257/77 |
| 2012/0237791 A1* | 9/2012 | Lin | 428/634 |
| 2013/0050807 A1* | 2/2013 | Lee et al. | 359/316 |

* cited by examiner

*Primary Examiner* — Jarrett Stark
*Assistant Examiner* — Shahed Ahmed
(74) *Attorney, Agent, or Firm* — Volpe and Koenig, P.C.

(57) ABSTRACT

The present invention related to a method for manufacturing a thermal dissipation substrate and a thermal dissipation substrate. The method includes steps of: (a) providing a substrate body having a surface; (b) forming a plurality of concave regions on the surface; and (c) filling the plurality of concave regions with a plurality of diamond materials. The thermal dissipation substrate includes: a substrate having a surface at a first horizontal; a plurality of regions formed on the surface at a second horizontal; and a plurality of diamond materials having a relatively high thermal coefficient and disposed on the plurality of regions.

16 Claims, 5 Drawing Sheets

THERMAL DISSIPATION SUBSTRATE

FIELD OF THE INVENTION

The present invention relates to a thermal dissipation substrate, and more particularly to a thermal dissipation substrate for high power semiconductors or electronic elements.

BACKGROUND OF THE INVENTION

With the development of the processing technique and the requirement of the electronic products, it is a trend to continuously get high efficiency and small size for semiconductors. Therefore, the thermal dissipation issue is getting more and more important, particularly on the high power or high frequency elements.

Taking light emitted diodes (LED) as an example, although the LED products are applied popularly due to many advantages, such as energy saving, power saving, high efficiency and etc., the efficiency of light emitting for the LEDs is influenced by the temperature. Therefore, if the thermal energy generated by the LEDs can not be conducted out, the temperature of the LEDs would be thus raised, which influences the efficiency of light emitting, the stability and the lifetime of the LEDs.

Taking a central processing unit (CPU) as an example, if the CPU overheats over a long period of time, it would cause the lifetime of the CPU be reduced, and the operating performance and the stability thereof would be affected also.

In order to prevent the electronic elements from the influences and harms caused by the high temperature, it is a common and intuitive method to get started with the thermal dissipation of the electronic elements. It can effectively raise the high power characteristic of the elements to use the materials with high thermal dissipation ability as the thermal dissipation substrate, wherein the diamonds have the best thermal conductivity of 1000~2500 W/Mk. The dissipation layer with the substrate made of diamonds can achieve a good thermal dissipation effect.

Although diamonds have the above advantages, the diamonds itself do not conduct electricity. In addition, there is a large difference between the hardness of diamonds and that of the substrate and the elements. Therefore, the difficulty of element cutting is increased.

Therefore the applicant attempts to deal with the above situation encountered in the prior art.

SUMMARY OF THE INVENTION

The present invention fills the patterned substrate with diamond pellets to fabricate a thermal dissipation substrate, and significantly mitigate the difficulty of cutting.

During the process of fabricating the substrate of the semiconductor, the method according to the present invention first filling the patterned substrate with diamond materials (such as diamond pellets) to fabricate a dissipation substrate, and then bonding the dissipation substrate and a semi-conductor or an electronic element (such as an LED or a CPU) by a wafer bonding technique. This would raise the element characteristics, and prevent from the drawback that diamond is a sort of a dielectric material having no conductivity and the cutting problem caused by the difference between the property of the diamond and that of the substrate or the element.

In accordance with the first aspect of the present invention, a method for manufacturing a thermal dissipation substrate is provided. The method includes steps of: (a) providing a substrate body having a surface; (b) forming a plurality of concave regions on the surface; and (c) filling the plurality of concave regions with a plurality of diamond materials.

Preferably, the step (b) further includes a step of using an etching method for patterning the surface to form the plurality of concave regions for correspondingly presenting a plurality of protruding regions.

Preferably, the etching method is one of a chemistry wet etching and a dry etching.

Preferably, the method further includes a step (d) of bonding the substrate body and an electronic element by a wafer bonding technique.

Preferably, the method further includes a step (e) of cutting the bonded substrate body by using bonding places formed between the plurality of protruding regions and the electronic element as cutting areas.

Preferably, the electronic element is one of an LED and a CPU.

Preferably, the wafer bonding technique uses one of a metal material and an epoxy material as a bonding material.

Preferably, the substrate body is one of a conductor and a semi-conductor.

Preferably, the substrate body has a material being one selected from a group consisting of a silicon (Si) material, a germanium (Ge) material, a silicon carbide (SiC) material, a copper (Cu) material, a copper alloy material, an aluminum (Al) material and an aluminum alloy material.

Preferably, the step (b) further includes a step (b1) of coating an adhesive bonding material on the plurality of concave regions.

Preferably, the adhesive bonding material is an epoxy material.

In accordance with the second aspect of the present invention, a method for manufacturing a thermal dissipation substrate is provided. The method includes steps of: providing a substrate body having a surface at a first horizontal; forming a plurality of regions at a second horizontal on the surface; and disposing a plurality of materials having a relatively high thermal coefficient onto the plurality of regions.

Preferably, the plurality of materials are a plurality of diamond materials.

Preferably, the forming step further includes a step of using an etching method for patterning the surface to form a plurality of concave regions as the plurality of regions at the second horizontal and correspondingly present a plurality of protruding regions at the first horizontal.

Preferably, the method further includes a step of bonding the substrate body and an electronic element by a wafer bonding technique.

Preferably, the method further includes a step of cutting the bonded substrate body by using bonding places formed between the plurality of protruding regions and the electronic element as cutting areas.

In accordance with the third aspect of the present invention, a thermal dissipation substrate is provided. The thermal dissipation substrate includes: a substrate having a surface at a first horizontal; a plurality of regions formed on the surface at a second horizontal; and a plurality of diamond materials having a relatively high thermal coefficient and disposed on the plurality of regions.

Preferably, the plurality of regions at the second horizontal are formed by using an etching method for patterning the surface to form a plurality of concave regions, and a plurality of protruding regions at the first horizontal are correspondingly presented.

Preferably, the substrate body is bonded with an electronic element by a wafer bonding technique.

Preferably, the thermal dissipation substrate further includes cutting areas located at bonding places formed between the plurality of protruding regions and the electronic element, and used for cutting the bonded substrate body.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 5:
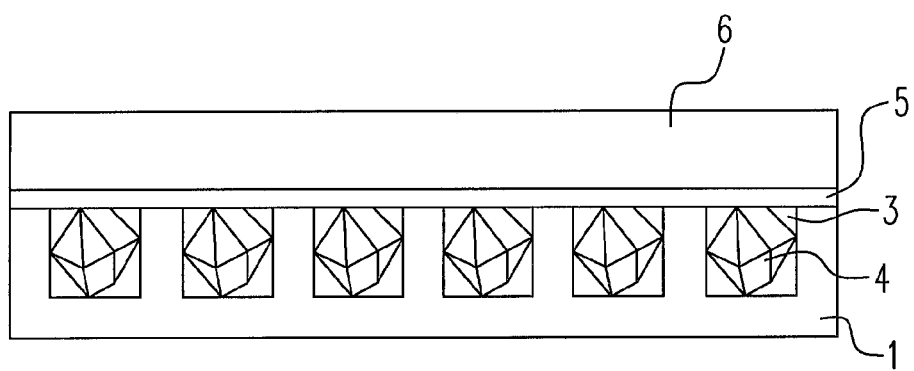
FIG. 5 is a diagram illustrating a side view that the substrate in the present is bonded to the heat source body 6 by a wafer bonding technique.

Please referring to FIG. 5, which is a diagram illustrating a side view of the thermal dissipation substrate in accordance with the present invention, for showing a preferable embodiment in accordance with the present invention. It can be seen in FIG. 5 that the thermal dissipation substrate in the present invention includes a substrate 1, a plurality of concave regions 2a and a material with a relatively high thermal coefficient, such as a plurality of diamond materials 4 filled in the plurality of concave regions 2a, wherein there is an adhesive bonding material 3 between the plurality of concave regions 2a and the plurality of diamond materials 4. A layer of a bonding material 5 is grown and bonded with a heat source body 6 in the following procedure. In this embodiment, the heat source body 6 is a semiconductor or an electronic element, and is preferably a high power LED or CPU. With regard to the preferable configuration of the relationship between the substrate 1 and the concave regions 2a, please referring to FIGS. 1(A)~1(D), which are diagrams illustrating top views of the concave regions 2a on the surface of the substrate 1. The configuration is not limited to the way illustrated in FIGS. 1(A)~1(D), but can be arranged according to the requirement of the following process.

Figure 8:
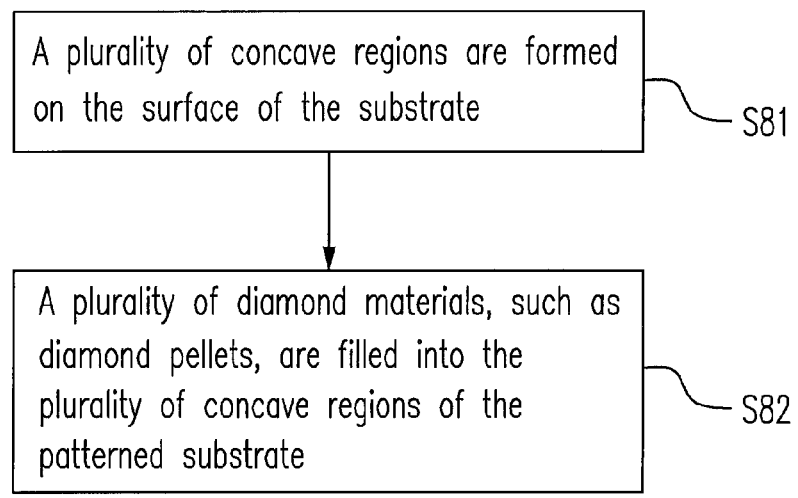
FIG. 8 is a flowchart for a preferred embodiment of a manufacturing method of a thermal dissipation substrate in the present invention.

Please referring to FIG. 8, which is a flowchart for a preferred embodiment of a manufacturing method of a thermal dissipation substrate in accordance with the present invention.

In step S81, a plurality of concave regions are formed on the surface of the substrate. Please referring to FIGS. 1(A)~1(D), which are diagrams illustrating top views of the configuration of the concave regions 2a on the surface of the substrate 1, as mentioned above, the configuration is not limited to the way illustrated in FIGS. 1(A)~1(D), but can be arranged according to the requirement of the following process.

In this embodiment, the material of the substrate 1 is preferably one of a conductor and a semiconductor, and the material is preferably one selected from a group consisting of a silicon (Si) material, a germanium (Ge) material, a silicon carbide (SiC) material, a copper (Cu) material, a copper alloy material, an aluminum (Al) material, an aluminum alloy material and a combination thereof. The way for forming the concave regions 2a is preferably using a series of steps including etching method to make the substrate be patterned, forming a patterned substrate with the plurality of concave regions formed on the surface of the substrate, and correspondingly presenting a plurality of protruding regions 1a. The way for etching can apply a chemistry wet etching or a dry etching based on the requirement in the process.

Figure 1A:
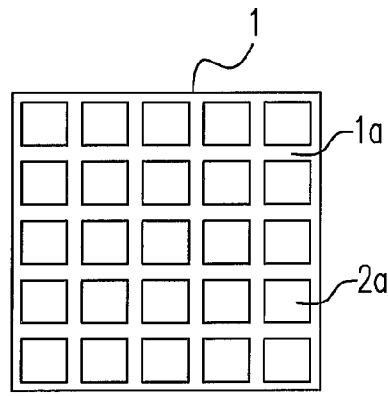
FIG. 1(A)~1(D) are diagrams illustrating top views of the preferable configurations of the concave regions 2a on the surface of the substrate 1 in the present invention.
Figure 1B:
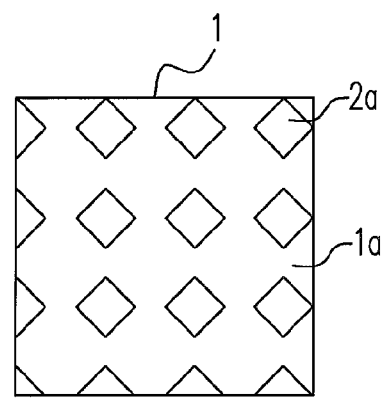
Figure 1C:
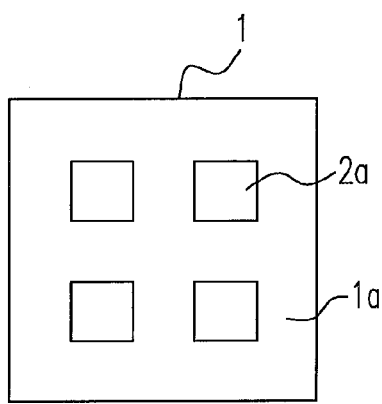
Figure 1D:
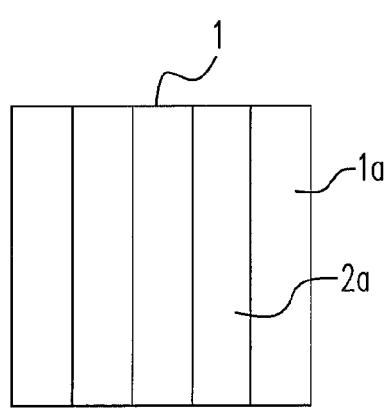
Figure 2:
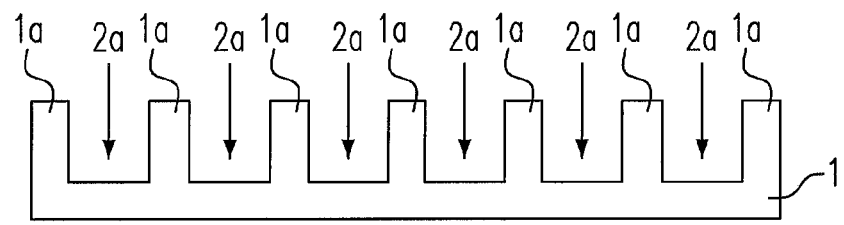
FIG. 2 is a diagram illustrating a side cross-sectional view after forming the concave regions 2a in the present invention.

FIG. 2 is a diagram illustrating a side cross-sectional view after forming the concave regions 2a. As mentioned above, the configuration of the concave regions 2a is not limited to the way illustrated in FIG. 2, but can be arranged according to the requirement of the following process.

In Step S82, the plurality of diamond materials 4, such as diamond pellets, are filled into the plurality of concave regions 2a of the patterned substrate.

Figure 3:
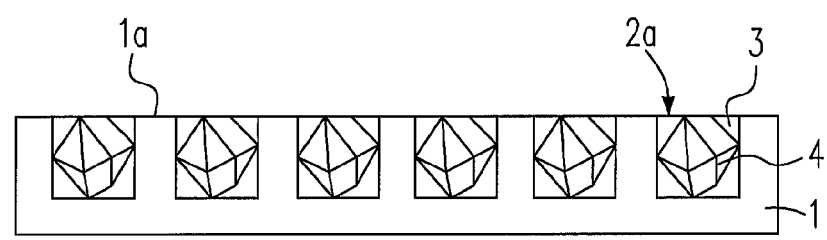
FIG. 3 is a diagram illustrating a side view after filling the diamond materials 4 to the substrate 1 in the present invention.

FIG. 3 is a diagram illustrating a side view after filling the diamond materials 4 to the substrate 1, wherein there is an adhesive bonding material 3 coated between the plurality of concave regions 2a of the substrate 1 and the plurality of diamond materials 4 in order to firmly bond the diamond materials 4 and the plurality of concave regions 2a. The adhesive bonding material 3 is preferably an epoxy material.

Figure 4:
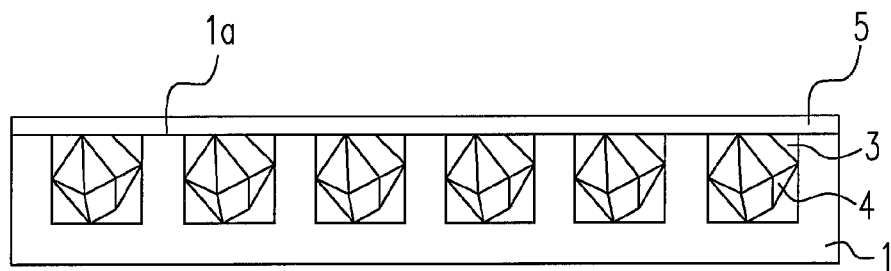
FIG. 4 is a diagram illustrating a side view that a layer of bonding material is grown after filling the diamond materials 4.
Figure 6:
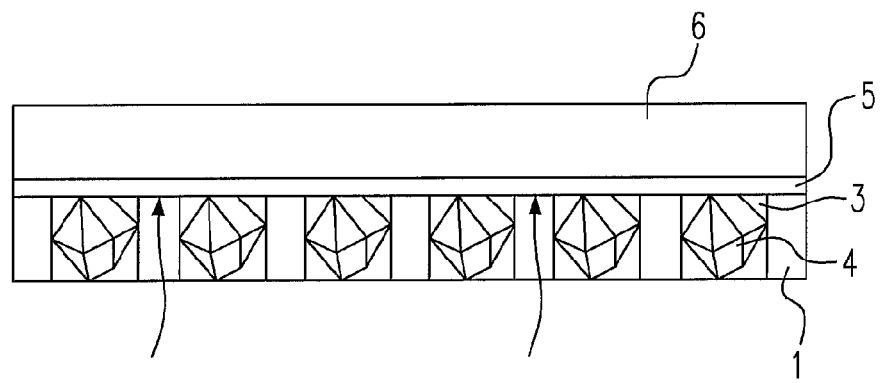
FIG. 6 is a diagram illustrating a side view that most of the redundant part of the substrate under the substrate 1 in FIG. 5 are removed by polishing in the manufacturing process in the present invention
Figure 7:
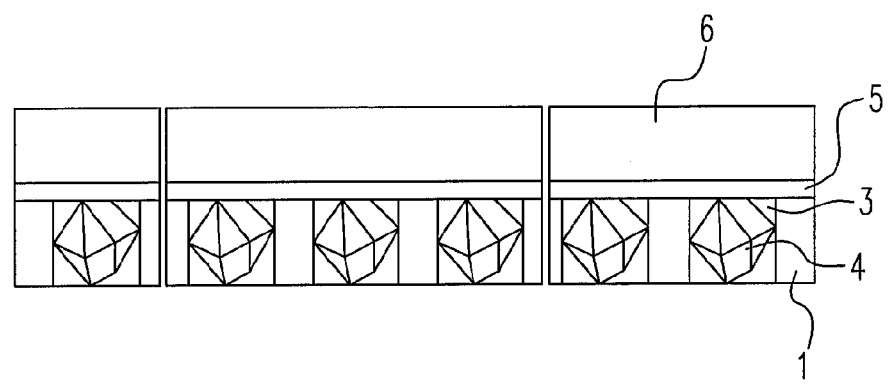
FIG. 7 is a diagram illustrating a side view that the corresponding bonding places between the protruding regions of the patterned substrate and the heat source body 6 are used as cutting areas for cutting in order to manufacture the needed semiconductors or electronic elements.

Subsequently, as shown in FIG. 4, a layer of bonding material 5 is grown on the substrate 1, and is then bonded to a heat source body 6 by a wafer bonding technique, and becomes the side view diagram as shown in FIG. 5. The wafer bonding technique preferably applies one of a metal material and an epoxy material as a bonding material. After bonding, a polishing method is applied to remove the redundant part of the substrate (by referring FIG. 6) and fine the surface thereof, in order to raise the thermal coefficient of the whole substrate. Then, the corresponding bonding places (such as pointed by the arrows in FIG. 6) between the protruding regions of the patterned substrate and the heat source body 6 are used as cutting areas, and are cut as shown in FIG. 7 to manufacture the required semiconductors or electronic elements (for example, high power LEDs or CPU, etc.). In addition, the step of removing the redundant part of the substrate may also be performed prior to growing the bonding material 5 and performing the wafer bonding.

Through the illustrations by the embodiments, in the present invention, the diamond materials 4 are placed in the concave regions 2a of the substrate 1 such that the corresponding bonding places between the protruding regions of the patterned substrate and the heat source body 6 can be used as cutting areas while performing the subsequent cutting process. Therefore, the drawback of the difficulty of element cutting resulted from the large difference between the hardness of diamonds and that of the substrate and the elements is resolved, and the high thermal coefficient of the thermal dissipation substrate and the convenience of cutting in the manufacturing process are also taken into account.

EMBODIMENTS

1. A method for manufacturing a thermal dissipation substrate, comprising steps of (a) providing a substrate body having a surface; (b) forming a plurality of concave regions on the surface; and (c) filling the plurality of concave regions with a plurality of diamond materials.

2. The method according to the previous embodiment, wherein the step (b) further comprises a step of using an etching method for patterning the surface to form the plurality of concave regions for correspondingly presenting a plurality of protruding regions.

3. The method according to any one of the previous embodiments, wherein the etching method is one of a chemistry wet etching and a dry etching.

4. The method according to any one of the previous embodiments further comprising a step (d) of bonding the substrate body and an electronic element by a wafer bonding technique.

5. The method according to any one of the previous embodiments further comprising a step (e) of cutting the bonded substrate body by using bonding places formed between the plurality of protruding regions and the electronic element as cutting areas.

6. The method according to any one of the previous embodiments, wherein the electronic element is one of an LED and a CPU.

7. The method according to any one of the previous embodiments, wherein the wafer bonding technique uses one of a metal material and an epoxy material as a bonding material.

8. The method according to any one of the previous embodiments, wherein the substrate body is one of a conductor and a semi-conductor.

9. The method according to any one of the previous embodiments, wherein the substrate body has a material being one selected from a group consisting of a silicon (Si) material, a germanium (Ge) material, a silicon carbide (SiC) material, a copper (Cu) material, a copper alloy material, an aluminum (Al) material and an aluminum alloy material.

10. The method according to any one of the previous embodiments, wherein the step (b) further comprises a step (b1) of coating an adhesive bonding material on the plurality of concave regions.

11. The method according to any one of the previous embodiments, wherein the adhesive bonding material is an epoxy material.

12. A method for manufacturing a thermal dissipation substrate, comprising steps of providing a substrate body having a surface at a first horizontal; forming a plurality of regions at a second horizontal on the surface; and disposing a plurality of materials having a relatively high thermal coefficient onto the plurality of regions.

13. The method according to the previous embodiment, wherein the plurality of materials are a plurality of diamond materials.

14. The method according to any one of the previous embodiments, wherein the forming step further comprises a step of using an etching method for patterning the surface to form a plurality of concave regions as the plurality of regions at the second horizontal and correspondingly present a plurality of protruding regions at the first horizontal.

15. The method according to any one of the previous embodiments further comprising a step of bonding the substrate body and an electronic element by a wafer bonding technique.

16. The method according to any one of the previous embodiments further comprising a step of cutting the bonded substrate body by using bonding places formed between the plurality of protruding regions and the electronic element as cutting areas.

17. A thermal dissipation substrate, comprising a substrate having a surface at a first horizontal; a plurality of regions formed on the surface at a second horizontal; and a plurality of diamond materials having a relatively high thermal coefficient and disposed on the plurality of regions.

18. The thermal dissipation substrate according to the previous embodiment, wherein the plurality of regions at the second horizontal are formed by using an etching method for patterning the surface to form a plurality of concave regions, and a plurality of protruding regions at the first horizontal are correspondingly presented.

19. The thermal dissipation substrate according to any one of the previous embodiments, wherein the substrate body is bonded with an electronic element by a wafer bonding technique.

20. The thermal dissipation substrate according to any one of the previous embodiments further comprising cutting areas located at bonding places formed between the plurality of protruding regions and the electronic element, and used for cutting the bonded substrate body.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for manufacturing a thermal dissipation substrate, comprising steps of:
    (a) providing a substrate body having a surface;
    (b) forming a plurality of concave regions on the surface and correspondingly presenting a plurality of protruding regions;
    (c) filling the plurality of concave regions with a plurality of diamond materials;
    (d) bonding the substrate body and an electronic element by a wafer bonding technique; and
    (e) cutting the bonded substrate body at bonding junctions, each of which is formed between a specific one of the plurality of protruding regions and the electronic element whereby the cutting avoids cutting through the plurality of concave regions with the plurality of diamond materials.

2. The method as claimed in claim 1, wherein the step (b) further comprises a step of using an etching method for patterning the surface to form the plurality of concave regions.

3. The method as claimed in claim 2, wherein the etching method is one of a chemistry wet etching and a dry etching.

4. The method as claimed in claim 1, wherein the electronic element is one of an LED and a CPU.

5. The method as claimed in claim 1, wherein the wafer bonding technique uses one of a metal material and an epoxy material as a bonding material.

6. The method as claimed in claim 1, wherein the substrate body is one of a conductor and a semi-conductor.

7. The method as claimed in claim 6, wherein the substrate body has a material being one selected from a group consisting of a silicon (Si) material, a germanium (Ge) material, a silicon carbide (SiC) material, a copper (Cu) material, a copper alloy material, an aluminum (Al) material and an aluminum alloy material.

8. The method as claimed in claim 1, wherein the step (b) further comprises a step (b1) of coating an adhesive bonding material on the plurality of concave regions.

9. The method as claimed in claim 8, wherein the adhesive bonding material is an epoxy material.

10. A method for manufacturing a thermal dissipation substrate, comprising steps of:
providing a substrate body having a surface at a first horizontal;
forming a plurality of first regions having edges at a second horizontal and formed on the surface;
correspondingly presenting a plurality of protruding second regions at the first horizontal;
disposing a plurality of materials having a relatively high thermal coefficient onto the plurality of regions;
bonding the substrate body and an electronic element; and
cutting the bonded substrate body at bonding junctions, each of which is formed between a specific one of the plurality of protruding second regions and the electronic element whereby the cutting avoids cutting through the plurality of concave regions with the plurality of diamond materials.

11. The method as claimed in claim 10, wherein the plurality of materials are a plurality of diamond materials.

12. The method as claimed in claim 11, wherein the forming step further comprises a step of using an etching method for patterning the surface to form a plurality of concave regions as the plurality of regions at the second horizontal.

13. The method as claimed in claim 12 further comprising a step of bonding the substrate body and the electronic element by a wafer bonding technique.

14. A thermal dissipation substrate, comprising:
a substrate having a surface at a first horizontal;
a plurality of first regions having edges at a second horizontal and formed on the surface;
a plurality of protruding second regions correspondingly presented at the first horizontal;
a plurality of diamond materials having a relatively high thermal coefficient and disposed on the plurality of regions;
an electronic element bonded with the substrate body; and
cutting areas located at bonding junctions, each of which is formed between a specific one of the plurality of protruding second regions and the electronic element whereby the cutting avoids cutting through the plurality of concave regions with the plurality of diamond materials.

15. The thermal dissipation substrate as claimed in claim 14, wherein the plurality of regions at the second horizontal are formed by using an etching method for patterning the surface to form a plurality of concave regions.

16. The thermal dissipation substrate as claimed in claim 15, wherein the substrate body is bonded with the electronic element by a wafer bonding technique.

* * * * *